United States Patent
Asami et al.

[11] Patent Number: 5,289,033
[45] Date of Patent: Feb. 22, 1994

[54] PACKAGING OF SEMICONDUCTOR CHIPS WITH RESIN

[75] Inventors: Yukio Asami, Kanagawa; Hiroyuki Fukasawa, Tokyo; Akira Kojima, Kanagawa, all of Japan

[73] Assignee: Sony Corporation, Tokyo, Japan

[21] Appl. No.: 690,358

[22] Filed: Apr. 24, 1991

[30] Foreign Application Priority Data

Apr. 25, 1990 [JP] Japan .................. 2-109934

[51] Int. Cl.$^5$ ............................................. H01L 23/28
[52] U.S. Cl. ................................... 257/676; 257/692; 257/787
[58] Field of Search ............ 357/72, 74, 65, 70; 257/676, 692, 787, 666, 735

[56] References Cited

U.S. PATENT DOCUMENTS

| | | | |
|---|---|---|---|
| 3,802,069 | 4/1974 | Thompson | 29/627 |
| 4,012,766 | 3/1977 | Phillips et al. | 357/70 |
| 4,069,924 | 1/1978 | McCorkle | 214/1 R |
| 4,255,851 | 3/1981 | Fortuna | 29/827 |
| 4,330,790 | 5/1982 | Burns | 357/70 |
| 4,331,740 | 5/1982 | Burns | 428/572 |
| 4,756,080 | 7/1988 | Thorp, Jr. et al. | 29/827 |
| 4,788,583 | 11/1988 | Kawahara et al. | 357/70 |
| 4,806,409 | 2/1989 | Walter et al. | 428/138 |
| 4,812,421 | 3/1989 | Jung et al. | 437/211 |
| 4,884,124 | 11/1989 | Mori et al. | 357/72 |
| 4,924,291 | 5/1990 | Lesk et al. | 357/70 |
| 5,018,003 | 5/1991 | Yasunaga et al. | 357/72 |

FOREIGN PATENT DOCUMENTS

| | | |
|---|---|---|
| 0213764 | 3/1987 | European Pat. Off. . |
| 0273725 | 7/1988 | European Pat. Off. . |
| 0350833 | 1/1990 | European Pat. Off. . |
| 0366386 | 5/1990 | European Pat. Off. . |
| 60-37754 | 2/1985 | Japan . |
| 1-262115 | 10/1989 | Japan . |
| 2-134852 | 5/1990 | Japan .................. 257/676 |

*Primary Examiner*—William Mintel
*Assistant Examiner*—Roy Potter
*Attorney, Agent, or Firm*—Hill, Steadman & Simpson

[57] ABSTRACT

A semiconductor device is fabricated by placing a semiconductor chip in a lead frame which has no die pad. Electrodes of the chip are connected by bonding wires to respective lead fingers. Additionally, the lead frame has movement restricting fingers which limit horizontal movement of the chip within the lead frame during injection of resin into a mold surrounding the chip. Furthermore, the mold has horizontal movement restricting projections to limit vertical movement of the chip within the mold cavity. The restriction on horizontal and vertical movement of the chip reduces the risk of the bonding wires being broken or short circuited during the resin injection process.

5 Claims, 3 Drawing Sheets

PACKAGING OF SEMICONDUCTOR CHIPS WITH RESIN

BACKGROUND OF THE INVENTION

1. Field of the Invention

This invention relates to packaging of semiconductor chips, and in particular various aspects of the present invention relate to a packaged semiconductor device, a combination of a semiconductor chip and a lead frame therefor, a method of manufacturing a semiconductor device, and a mold for molding a resin package around an assembly of a semiconductor chip and a plurality of lead fingers.

2. Description of the Prior Art

There are a number of known manners of manufacturing a semiconductor device, in which a semiconductor chip is sealed in a resin package. FIG. 4 of the accompanying drawings shows a known "die pad" construction in which a chip c is bonded to a die-pad a by a bonding material d, such as a silver paste or a gold-silicon eutectic alloy. The die-pad a is connected to a peripheral portion of a lead frame by connecting fingers a'. A plurality of lead fingers b project from the peripheral portion of the lead frame, and each lead finger b is connected to a respective electrode of the chip c by a respective bonding wire e. The chip c, die-pad a, bonding wires e and inner ends of the fingers a', b are then placed in a molding die and sealed in a resin package.

Another known "chip-on-lead" type of construction is shown in FIG. 5. In this case, an insulator f, such as a polyimide sheet, is placed on the inner ends of lead fingers b, a semiconductor chip c is placed on the insulator f and the electrodes of the semiconductor chip c are connected to respective inner ends of the lead fingers b by respective bonding wires e. Again, the assembly is then sealed in a resin package.

A further known "lead-on-chip" type of construction is shown in FIG. 6. In this case, a surface of a semiconductor chip C, excluding the electrodes thereon, is covered with an insulator f, lead fingers b are placed on the insulator f, and the lead fingers b are connected to respective electrodes by respective bonding wires e. Once again, the assembly is then sealed in a resin package.

Lastly, FIG. 7 shows a known "directly connected" form of construction, in which electrode pads g of a semiconductor chip c project upwardly from the upper surface of the chip c, and the inner ends of lead fingers b are directly connected to the electrode pads g. The assembly is then sealed in a resin package.

It is desirable that the height of the semiconductor device is as small as possible. However, in the die pad construction described above, the thickness of the die pad a and bonding material d add to the height of the package. In the chip-on-lead and lead-on-chip forms of construction described above, the thickness of the insulators f and the lead fingers b add to the height of the package. In the directly connected form of construction described above, the thickness of the lead fingers b and the height of the electrode pads g add to the overall height of the semiconductor package. Also, the die pad construction suffers from the problem that thermal stress is induced in the device due to differences in the coefficients of thermal expansion of the die pad a, the semiconductor chip c and the resin of the package, which can cause a breakdown in bonding between the chip c and the die pad a, between the die pad a and the resin package, or between the chip c and the resin package.

OBJECT AND SUMMARY OF THE INVENTION

One object of the present invention is to enable a semiconductor device to be produced which has a decreased height.

Another object of the present invention is to alleviate thermal stresses in the semiconductor package.

A further object of the present invention is to enable the semiconductor device to be produced reliably, such that there is a small risk of the bonding wires being broken or short circuited while the resin package is being formed around the assembly of the chip, bonding wires and lead fingers.

In accordance with one aspect of the present invention, there is provided a semiconductor device, in which the inner ends of the lead fingers lie between the planes of the upper and lower surfaces of the semiconductor chip, and the resin package directly contacts both the upper surface and the lower surface of the chip. Thus, a reduced height package is provided, and no thermal stress is induced due to the presence of a die pad.

The lead fingers may be provided by portions of a lead frame, and preferably additional finger portions are provided which do not normally contact the chip, but which restrict lateral movement of the chip with respect to the lead frame during molding of the resin package around the assembly.

In accordance with another aspect of the present invention, there is provided a mold for molding a resin package around an assembly comprising a semiconductor chip having a plurality of electrodes, a plurality of lead fingers projecting away from said chip, and a plurality of bonding wires each connecting a respective one of said electrodes to a respective one of said lead fingers. The mold comprises first and second complementary mold parts. At least one projection projects from at least one of the mold parts interiorly of the mold cavity provided by the mold parts for restricting movement of the chip in the mold cavity when resin is injected into the mold cavity.

Other objects, features and advantages of the present invention will become apparent upon consideration of the following detailed description of a preferred embodiment thereof, especially when considered with the accompanying drawings in which like reference numerals are employed to designate the same or similar components in the different figures.

DETAILED DESCRIPTION OF THE PREFERRED EMBODIMENT

Figure 1:
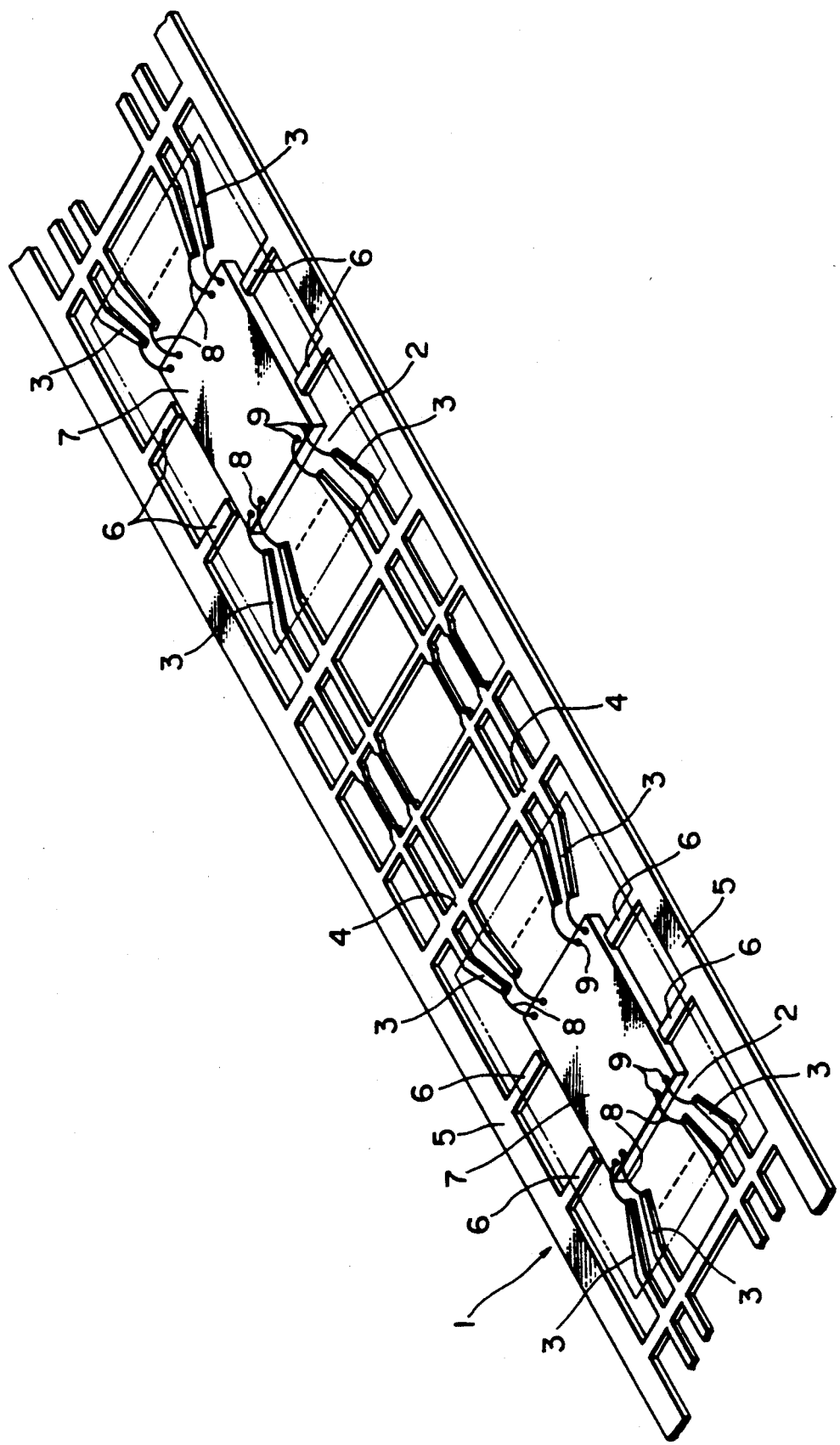
FIG. 1 is a partial perspective view of a lead frame to which are connected a pair of semiconductor chips.
Figure 2:
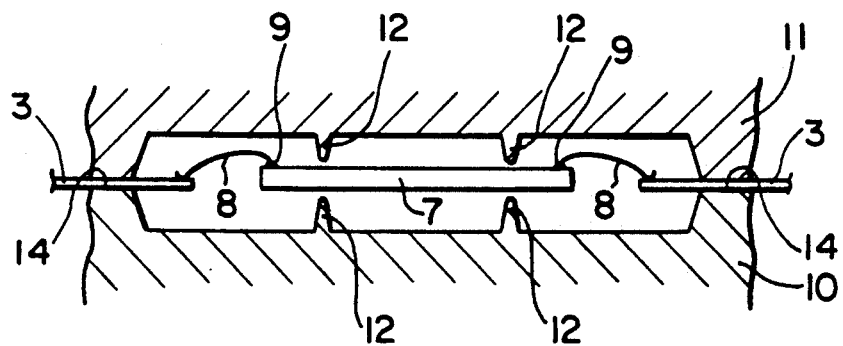
FIG. 2 is a sectional view of a molding die loaded with a lead frame and a semiconductor chip.
Figure 3:
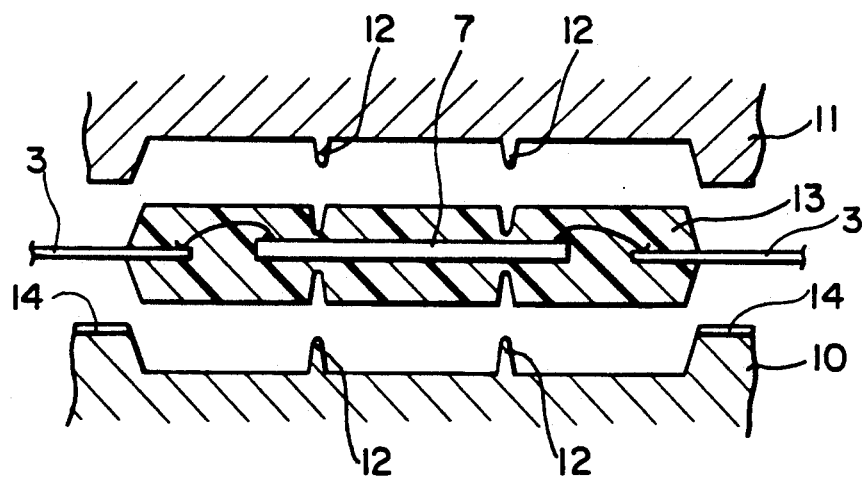
FIG. 3 is a sectional view of a resin package as formed by the molding die of FIG. 2.
Figure 4:
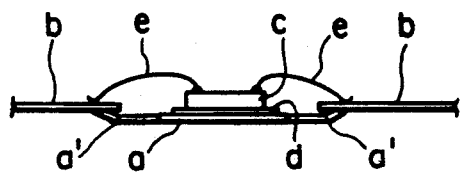
FIG. 4 is a sectional view of a known die pad form of assembly of a lead frame and semiconductor chip.
Figure 5:
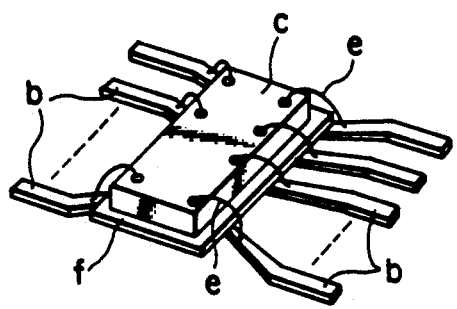
FIG. 5 is a perspective view of a known chip-on-lead form of assembly of semiconductor chip and lead frame.
Figure 6:
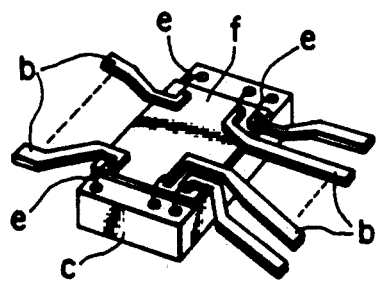
FIG. 6 is a perspective view of a known lead-on-chip form of assembly of a semiconductor chip and lead frame.
Figure 7:
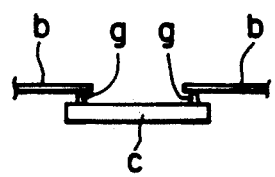
FIG. 7 is a sectional view of a known direct connection form of assembly of a semiconductor chip and lead frame.

Referring to FIGS. 1 to 3, a lead frame 1 for manufacturing a plurality of semiconductor devices has apertures 2 for receiving semiconductor chips 7 in a longitudinal arrangement at regular intervals. The apertures 2 are provided instead of the die pads in the known die pad form of construction. Each aperture 2 is of a size such that the respective chip 7 could be passed through the aperture.

The lead frame 1 has peripheral frame members 5 surrounding each aperture 2, tie bars 4 connecting portions of the lead frame for each chip, lead fingers 3 projecting towards each aperture 2 and horizontal movement restricting fingers 6 projecting inwardly from the side portions of the frame members 5 towards the apertures 2.

Each semiconductor chip 7 is placed in the respective aperture 2. The size of the aperture 2 (defined by inner ends of the lead fingers 3 and movement restricting fingers 6) is such that the lead fingers 3 and the movement restricting fingers 6 do not contact the chip 7.

Each chip 7 has a plurality of electrodes 9, and each electrode is connected to the inner end of a respective one of the lead fingers 3 by a respective bonding wire 8. Thus, each semiconductor chip 7 is connected to the lead frame 1 solely by the bonding wires 8.

Then, the lead frame 1, with the chips 7 connected thereto, is placed in a molding die, as shown in FIG. 2. The molding die comprises a lower die part 10 and a complementary upper die part 11, and the lead fingers and movement restricting fingers pass through channels 14 between the die parts 10,11. Both die parts 10,11 are provided with vertical movement restricting pins 12, which project towards the chip 7, but which are slightly separated from the upper and lower surfaces of the chip 7. After the chip 7 has been placed in the molding die, supported solely by the lead frame 1 and the bonding wires 8, resin is injected into the mold cavity of the molding die to seal the semiconductor chip, the bonding wires 8, and the inner ends of the lead fingers 3 within a resin package 13 as shown in FIG. 3.

Although the resin his a sufficiently low viscosity in the initial stage of injection of resin into the mold cavity, the resin tends to urge the chip 7 vertically either towards the lower die part 10 or the upper die part 11, due to slight differences in resistance against the flow of the resin between the upper and lower surfaces of the semiconductor chip 7. However, vertical movement of the chip 7 is restricted by the vertical movement restricting projections 12, so that the chip 7 cannot significantly move towards the lower die part 10 or upper die part 11. As injection progresses, the resin becomes distributed uniformly within the mold cavity, and the resin tends to fill the gaps between the tips of the vertical movement restricting projections 12 and the upper and lower surfaces of the chip 7. Once injection of the resin has been completed, the chip 7 tends to return to its original position within the molding die, and therefore partial exposure of the chip 7 at the locations of the movement restricting projections 12 is unlikely to occur. The viscosity of the resin being injected may also tend to urge the chip sideways in the mold cavity. However, sideways movement of the chip is restricted not only by the bonding wires 8, but also by the horizontal movement restricting fingers 6. Even if the tip of one or more of the horizontal movement restricting fingers 6 possibly remains in contact with a side surface of the chip 7 after the resin has hardened, no problem arises because the portions of the horizontal movement restricting projections which project outside the resin package 13 are subsequently cut off.

After the resin has hardened, the lower and upper die parts 10,11 are separated, and the lead frame with the packages molded thereon are removed. Then, the horizontal movement restricting portions 6 are cut off flush with the side of each package 13, and the lead fingers 3 are severed each at a location spaced from the resin package so as to form individual connecting leads for the chips.

Having described a preferred embodiment of the invention with reference to the accompanying drawings, it is to be understood that the invention is not limited to the precise embodiment and that various changes and modification thereof may be effected by one skilled in the art without departing from the spirit or scope of the invention as defined in the appended claims.

What is claimed is:

1. A semiconductor device, comprising:
   a resin package;
   a semiconductor chip sealed within said package, said chip having upper and lower surfaces lying in upper and lower planes, respectively, and said chip having a plurality of electrodes;
   a peripheral portion surrounding a region for receiving said chip;
   a plurality of lead fingers each having an outer end disposed outside said package and each having an inner end disposed within said package and lying between said upper and lower planes and projecting from said peripheral portion towards said region; and
   a plurality of bonding wires each connecting a respective one of said plurality of electrodes to a respective one of said inner ends of said lead fingers;
   wherein said chip is disposed in said region without rigid connection to any of said lead fingers before sealing in said resin package such that said resin package directly contacts substantially all of said chip.

2. A combination comprising a semiconductor chip having a plurality of electrodes, a lead frame and a plurality of bonding wires each connected at first ends thereof to selective ones of said electrodes for use in manufacturing a semiconductor device from said chip, said lead frame comprising;
   a peripheral portion surrounding a region for receiving said chip; and
   a plurality of finger portions projecting from said peripheral portion towards said region and terminating outside said region, said plurality of bonding wires connected at second ends thereof to selective ones of said finger portions, said chip disposed in said region without contacting said finger potions such that the lead frame provides a through aperture in said region for receiving said chip, said chip supported in said through aperture by said bonding wires.

3. A combination as claimed in claim 2, wherein said lead frame comprises a plurality of movement restricting finger portions for restricting movement of said chip during manufacture of said device.

4. A combination as claimed in claim 2, further comprising:
a resin package;
said semiconductor chip sealed within said package, said chip having upper and lower surfaces lying in upper and lower planes, respectively;
said plurality of finger portions each having an outer end disposed outside said package and each having an inner end disposed within said package and lying between said upper and lower planes;
wherein said resin package directly contacts both said upper surface and said lower surface of said chip.

5. A combination as claimed in claim 4 wherein said resin package directly contacts substantially all of said chip.

* * * * *